(12) United States Patent
Rossi et al.

(10) Patent No.: US 10,236,314 B2
(45) Date of Patent: *Mar. 19, 2019

(54) OPTICAL DEVICES AND OPTO-ELECTRONIC MODULES AND METHODS FOR MANUFACTURING THE SAME

(71) Applicant: ams Sensors Singapore Pte. Ltd., Singapore (SG)

(72) Inventors: Markus Rossi, Jona (CH); Hartmut Rudmann, Jona (CH); Stephan Heimgartner, Passugg (CH); Alexander Bietsch, Thalwil (CH); Robert Lenart, Zurich (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/341,210

(22) Filed: Nov. 2, 2016

(65) Prior Publication Data
US 2017/0077162 A1    Mar. 16, 2017

Related U.S. Application Data

(63) Continuation of application No. 14/366,770, filed as application No. PCT/EP2012/005224 on Dec. 18, 2012, now Pat. No. 9,490,287.

(Continued)

(51) Int. Cl.
| | |
|---|---|
| *H01L 27/14* | (2006.01) |
| *H01L 27/146* | (2006.01) |
| *H01L 27/148* | (2006.01) |

(52) U.S. Cl.
CPC .... *H01L 27/14625* (2013.01); *H01L 27/1469* (2013.01); *H01L 27/14618* (2013.01);
(Continued)

(58) Field of Classification Search
CPC ............................ G02B 3/0056; G02B 3/0031
(Continued)

(56) References Cited

U.S. PATENT DOCUMENTS

| | | | |
|---|---|---|---|
| 4,425,501 A | 1/1984 | Stauffer | |
| 8,049,806 B2 * | 11/2011 | Feldman | G02B 9/12 257/432 |

(Continued)

FOREIGN PATENT DOCUMENTS

| | | |
|---|---|---|
| DE | 39 34 301 | 4/1990 |
| EP | 0 285 796 | 10/1988 |

(Continued)

OTHER PUBLICATIONS

European Patent Office, International Search Report for International Patent Application PCT/EP2012/005224 (dated May 14, 2013).

*Primary Examiner* — James Greece
(74) *Attorney, Agent, or Firm* — Fish & Richardson P.C.

(57) ABSTRACT

The optical device comprises a first substrate comprising at least one optical structure comprising a main portion and a surrounding portion at least partially surrounding said main portion. The device furthermore comprises non-transparent material applied onto said surrounding portion. The opto-electronic module comprises a plurality of these optical devices comprised in said first substrate.

The method for manufacturing an optical device comprises the steps of
a) providing a first substrate comprising at least one optical structure comprising a main portion and a surrounding portion at least partially surrounding said main portion; and
b) applying a non-transparent material onto at least said surrounding portion.

(Continued)

Said non-transparent material is present on at least said surrounding portion still in the finished optical device.

16 Claims, 4 Drawing Sheets

Related U.S. Application Data

(60) Provisional application No. 61/578,538, filed on Dec. 21, 2011.

(52) U.S. Cl.
CPC .. *H01L 27/14623* (2013.01); *H01L 27/14627* (2013.01); *H01L 27/14683* (2013.01); *H01L 27/14685* (2013.01); *H01L 27/14687* (2013.01); *H01L 27/14818* (2013.01); *H01L 2924/0002* (2013.01)

(58) Field of Classification Search
USPC .................................................. 359/619–628
See application file for complete search history.

(56) References Cited

U.S. PATENT DOCUMENTS

| | | | |
|---|---|---|---|
| 2006/0226452 | A1 | 10/2006 | Yamaguchi |
| 2011/0176022 | A1 | 7/2011 | Cho et al. |

FOREIGN PATENT DOCUMENTS

| | | |
|---|---|---|
| EP | 0 309 947 | 4/1989 |
| EP | 1 244 151 | 9/2002 |
| EP | 1 357 514 | 7/2008 |
| WO | 2009/076787 | 6/2009 |
| WO | 2009/076789 | 6/2009 |
| WO | 2009/151903 | 12/2009 |

\* cited by examiner

OPTICAL DEVICES AND OPTO-ELECTRONIC MODULES AND METHODS FOR MANUFACTURING THE SAME

CROSS-REFERENCE TO RELATED APPLICATION(S)

This application is a continuation of U.S. application Ser. No. 14/366,770, filed on Jun. 19, 2014, which is the National Stage of International Application No. PCT/EP2012/005224, filed on Dec. 18, 2012, which claims the benefit of priority U.S. Application No. 61/578,538, filed on Dec. 21, 2011.

TECHNICAL FIELD

The invention relates to the field of optics and optoelectronics, and in particular to micro optics and micro-optoelectronics. More particularly, it relates to optical sensors or sensor modules such as, e.g., usable in cameras and more specifically in multi-channel or computational cameras. The invention relates to methods and apparatuses according to the opening clauses of the claims.

DEFINITION OF TERMS

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have opening or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

BACKGROUND OF THE INVENTION

Multi-aperture cameras or computational cameras are gaining importance these days. In such cameras, several multi-pixel images are taken—usually practically simultaneously—of at least practically the same scene and then, using some kind of algorithm, used for forming a final image of said scene. E.g., functions such as focusing that previously had to be carried out mechanically can be carried out by suitable software in accordance with said concept. One way to accomplish this has become known as the so-called 'plenoptic camera' that uses data on the direction from which radiation impinges to calculate 3D information of an image taken. There is also software available that can calculate a high resolution image from a plurality of low resolution images taken from a same viewpoint at the same time. An example of an according teaching can be found in EP 1 357 514 and the references cited therein. A further example of an according teaching that relates to a camera array is disclosed in WO 2009/151903.

It is also possible to create a color image from such multi-pixel images each taken with light of different colors. Or, the multi-pixel images could be taken at different sensitivities so as to accomplish an increased dynamic range of the final image.

It can be a demand to miniaturize such cameras. And it can be advantageous to keep light from being detected in one of said channels which does not belong into that channel and more particularly to minimize cross-talk, i.e. to minimize the spilling over of light from one of the channels into another one of the channels.

SUMMARY OF THE INVENTION

One object of the invention is to create an optical device and an opto-electronic module which provides a particularly good optical quality. In addition, a way of manufacturing such optical devices and said opto-electronic modules, respectively, shall be provided as well as corresponding wafers and wafer stacks and electronic devices. Furthermore, a use of resist material shall be provided.

Another object of the invention is to provide a miniaturized optical device and/or opto-electronic module.

Another object of the invention is to provide a way of efficiently manufacturing optical devices and opto-electronic modules, respectively, in particular on wafer level.

Another object of the invention is to provide a particularly small computational camera or multi-aperture camera having good optical quality.

Another object of the invention is to provide opto-electronic modules in which stray light is largely suppressed.

Further objects emerge from the description and embodiments below.

At least one of these objects is at least partially achieved by apparatuses and methods according to the patent claims.

The optical device comprises a first substrate comprising at least one optical structure comprising
    a main portion; and
    a surrounding portion at least partially surrounding said main portion.

And the device furthermore comprises non-transparent material applied onto said surrounding portion.

Such devices can be of particularly good optical quality, in particular as it comes to stray light suppression. And such devices can be useful in opto-electronic modules, in particular for enabling the design of particularly small multi-channel opto-electronic modules.

In one embodiment, said main portion and said surrounding portion form a unitary part.

In one embodiment which may be combined with the before-addressed embodiment, said optical structure made is of a transparent material.

The terms transparent and non-transparent are usually to be understood to refer to light of at least a specific sprectral portion.

In one embodiment which may be combined with one or more of the before-addressed embodiments, said first substrate is generally planar.

In one embodiment which may be combined with one or more of the before-addressed embodiments, said surrounding portion fully surrounds said main portion.

In one embodiment which may be combined with one or more of the before-addressed embodiments, said surrounding refers generally to a plane parallel to a plane described by said first substrate.

In one embodiment which may be combined with one or more of the before-addressed embodiments, at least a portion of said main portion is free from said non-transparent material; more particularly, said main portion may be free from said non-transparent material. It may be provided that merely a portion of said main portion is free from said non-transparent material, in other words: It is possible to provide that non-transparent material is (and remains to be) applied to a portion of said main portion.

In one embodiment which may be combined with one or more of the before-addressed embodiments, said non-transparent material is applied to the whole surface area of said surrounding portion, wherein an area forming an interface is not considered a surface.

In one embodiment which may be combined with one or more of the before-addressed embodiments, said optical structure is sitting on said first substrate or is located fully or in part in said first substrate, more particularly located fully or in part in an opening of said first substrate.

In one embodiment which may be combined with one or more of the before-addressed embodiments, said main portion forms a passive optical component, in particular a lens or a lens element, more particularly a refractive lens or lens element.

In one embodiment which may be combined with one or more of the before-addressed embodiments, the device comprises further non-transparent material applied onto a surface portion of said first substrate adjacent to said surrounding portion. Said surface portion of the first substrate usually at least partially and typically fully surrounds said surrounding portion. Usually, the same type of non-transparent material is applied on said surface portion of the first substrate and on said surrounding portion.

In one embodiment which may be combined with one or more of the before-addressed embodiments, the device comprises a layer of said non-transparent material, said layer substantially coating said surrounding portion.

In one embodiment referring to the last-addressed embodiment, said layer substantially coats, in addition, a surface portion of said first substrate adjacent to said surrounding portion. And, alternatively or additionally, said layer may also coat a portion of said main portion.

In one embodiment which may be combined with one or more of the before-addressed embodiments, said non-transparent material is a resist material, in particular a polymer-based resist material. Said non-transparent material can be a lithographically structurable material. The resist material can be positive or a negative resist.

In one embodiment which may be combined with one or more of the before-addressed embodiments, said non-transparent material is black, or is white, or has another color.

In one embodiment which may be combined with one or more of the before-addressed embodiments, said non-transparent material is photostructurable, in particular photostructurable by means of UV radiation.

A wafer according to the invention comprises a multitude of optical devices according to the invention. The optical devices can be arranged next to each other, typically on a rectangular grid. And, it is possible to provide that non-transparent material applied to surrounding portions of different optical structures is not contiguous (but separate). It is, however, possible to provide that non-transparent material applied to surrounding portions of different optical structures is contiguous for some of the optical structures, e.g., for groups of optical structures such as for optical structures belonging to one and the same optical module, and even for all optical structures of a wafer.

An opto-electronic module according to the invention comprises at least one optical device according to the invention.

In one embodiment of the opto-electronic module (in short: "module"), the module comprises at least one active optical component arranged in a distance to said main portion, in particular wherein said at least one active optical component is a light detector for detecting light having passed said main portion. Said light detector can in particular be a multi-pixel light detector, e.g., one comprising a pixel array.

In one module embodiment which may be combined with the before-addressed embodiment, the module comprises a second substrate comprising said at least one active optical component.

In one embodiment referring to the last-addressed embodiment, the module comprises a spacer member arranged between said first substrate and said second substrate, for establishing a well-defined distance between said first substrate and said second substrate. This way, also a well-defined distance between said at least one passive optical component and said at least one main portion can be achieved. It can be provided that via said spacer member, said first substrate and said second substrate are fixed with respect to each other. However, it may also be provided that said spacer member is integrally formed with said first or with said second substrate. Thus, instead of being separate (and separately manufactured) bodies, the spacer member may be comprised in said first or in said second substrate.

In one embodiment which may be combined with one or more of the before-addressed module embodiments, the module is an optical sensor, in particular a camera or a module for a camera.

In a specific aspect of the invention, an opto-electronic module according to the invention comprises a plurality of optical devices according to the invention comprised in said first substrate. This aspect is related to multi-channel modules, in particular to particularly small multi-channel modules. Note that the non-transparent material applied to the optical structures of the opto-electronic module may be contiguous, but may, however, also be separate for each optical device and even separate for each optical structure.

In one embodiment of this aspect, the module comprises a plurality of active optical components. In particular, each of said active optical components is a light detector, e.g., multi-pixel light detector. Each of said active optical components can comprise a pixel array, each of the active optical components can be, e.g., a CMOS or a CCD image sensor.

In one embodiment referring to the last-addressed embodiment, said plurality of optical structures are N≥2 optical structures, and said plurality of active optical components are N≥2 active optical components, each of said N active optical components being assigned to and aligned with respect to one of said N optical structures. N is an integer. E.g., each one active optical component and its associated optical structure can form an optical channel. E.g., the active optical components are light detectors, and each light detector is provided for detecting light having traversed the main portion of the respective associated optical structure.

In one embodiment referring to one or both of two the last-addressed embodiments, the module comprises a second substrate comprising said plurality of active optical components.

In one embodiment referring to the last-addressed embodiment, the module comprises a spacer member arranged between said first substrate and said second substrate, for establishing a well-defined distance between said first substrate and said second substrate. In particular, it can be provided that via said spacer member, said first substrate and said second substrate are fixed with respect to each other.

In one embodiment referring to the last-addressed embodiment, said spacer member is not in contact with said first substrate in any area of said first substrate between any two of said plurality of optical structures. Alternatively or additionally, said spacer member is not in contact with said second substrate in any area of said second substrate between any two of said plurality of active optical components.

Therein, of course, a bonding agent or glue may be present between the spacer member and the first or second substrate where the two are in mutual contact.

In one embodiment referring to one or both of the two last-addressed embodiments, said spacer member forms an opening, and said spacer comprises at least one wall member at least partially surrounding said opening, in particular wherein said at least one wall member forms a portion of a housing of said module.

In one embodiment referring to the last-addressed embodiment, in said opening, no material portion of said spacer member is located. Note that a "material portion" distinguishes from, e.g., an opening (because an opening does not comprise material).

In one embodiment which may be combined with one or more of the before-addressed embodiments of said specific aspect in which said spacer member is comprised, said first and second substrates are generally planar describing parallel planes, and wherein, in a projection into any one of these parallel planes, each of said plurality of optical structures and each of said plurality of active optical components lie within said spacer member. In other words, the projection of each of said plurality of optical structures into a plane parallel to said parallel planes and a projection of each of said plurality of active optical components into said plane lie in a projection of said spacer member into said plane.

In one embodiment referring to the last-addressed embodiment, in said projection into any of these parallel planes, no portion of said spacer member is located between any two of said plurality of optical structures or between any two of said plurality of active optical components.

In one embodiment which may be combined with one or more of the before-addressed module embodiments, the module is a multi-channel optical sensor.

In one embodiment which may be combined with one or more of the before-addressed module embodiments, the module is a multi-channel camera or a module for a multi-channel camera or a multi-aperture camera or a module for a multi-aperture camera. E.g., the opto-electronic module can be at least one of
 a computational camera or a module therefor;
 an array camera or a module therefor;
 a plenoptic camera or a module therefor;
 a photo camera or a module therefor;
 a video camera or a module therefor.

The invention further comprises a wafer stack comprising a first wafer comprising a multitude of optical devices according to the invention and a second wafer and a spacer wafer arranged between said first and said second wafer. Said spacer wafer usually is provided in order to establish a well-defined distance between said first wafer and said second wafer. And/or via said spacer wafer, said first wafer and said second wafer are fixed with respect to each other. It is possible to provide that said spacer wafer is comprised in said first wafer or in said second wafer (in particular, the spacer wafer may be manufactured together with a precursor of the first or of the second wafer in one process), but usually, they are separate wafers.

In one embodiment of the wafer stack, said second wafer comprises a multitude of active or passive optical components. In particular, therein, each of said multitude of active or passive optical components is associated with at least one of said optical devices.

In one embodiment referring to the last-addressed embodiment, said spacer wafer forms a multitude of openings laterally delimited by material portions of said spacer wafer, wherein the wafer stack comprises a multitude of laterally defined portions, each of said portions of the wafer stack comprising
 exactly one of said multitude of openings;
 a plurality of said active or passive optical components; and
 a plurality of said optical devices.

In one embodiment referring to the last-addressed embodiment, each of said laterally defined portions of the wafer stack comprises no material portion of said spacer wafer in contact with said first wafer within said opening.

In one embodiment referring to one or both of the two last-addressed embodiments, each of said laterally defined portions of the wafer stack comprises no material portion of said spacer wafer in contact with said second wafer within said opening.

In one embodiment which may be combined with one or more of the before-addressed wafer stack embodiments comprising said opening, within each of said laterally defined portions of the wafer stack, for at least one side of said first wafer, substantially the whole surface of said side of the first wafer which is not occupied by said main portions of the respective optical structures is covered with said non-transparent material. However, it is also possible to provide that merely a portion the surface of said side of the first wafer which is not occupied by said main portions of the respective optical structures is covered with said non-transparent material.

In one embodiment which may be combined with one or more of the before-addressed wafer stack embodiments, said second wafer comprises a multitude of optical devices according to the invention.

In one embodiment which may be combined with one or more of the before-addressed wafer stack embodiments, said second wafer comprises a multitude of light detectors, in particular a multitude of multi-pixel light detectors.

In one embodiment which may be combined with one or more of the before-addressed wafer stack embodiments, each of said laterally defined portions of said first wafer forms an opto-electronic module, in particular an opto-electronic module according to the invention.

In one embodiment which may be combined with one or more of the before-addressed wafer stack embodiments, each of said laterally defined portions of said first wafer comprises a material portion of said spacer wafer delimiting the respective opening.

In one embodiment referring to one or both of the two last-addressed embodiments, for each of said laterally defined portions of said first wafer, said material portion of said spacer wafer delimiting the respective opening forms a portion of a housing of the respective opto-electronic module.

In another view of the invention, the wafer stack comprises a multitude of opto-electronic modules according to the invention and/or, more specifically, a multitude of opto-electronic modules according to the invention in the above-addressed specific aspect of the invention.

The invention further comprises an electronic device comprising at least one optical device according to the invention and/or at least one opto-electronic module according to the invention (the invention comprising the above-addressed specific aspect of the invention).

In particular, said electronic device is at least one of
a communication device, more particularly a handheld communication device;
a photographic device, more particularly a photo camera or a video camera;
a music playing device, more particularly a handheld music playing device;
a computing device, more particularly a mobile computing device, e.g., a tablet computer or a laptop computer;
an optical sensor, in particular a multi-channel optical sensing apparatus.

The method for manufacturing an optical device comprises the steps of
a) providing a first substrate comprising at least one optical structure comprising a main portion and a surrounding portion at least partially surrounding said main portion;
b) applying a non-transparent material at least onto said surrounding portion.

In one embodiment of the method, said non-transparent material is present on at least said surrounding portion in the finished optical device.

In one embodiment which may be combined with the before-addressed embodiment, step b) comprises the step of
b1) applying said non-transparent material by at least one of spray coating and spin coating.

In one embodiment which may be combined with one or more of the before-addressed method embodiments, said first substrate comprises a first side on which said surrounding portion is present, wherein step b) comprises the step of
b2) applying said non-transparent material to said first side substantially in full.

In one embodiment referring to one or both of the two last-addressed embodiments, the method comprises the step of
u) structuring the non-transparent material applied in step b1) and/or step b2), in particular using photostructuring.

The structuring can be accomplished, e.g., photolithographically.

In one embodiment which may be combined with one or more of the before-addressed method embodiments, said non-transparent material is a resist material, in particular a polymer-based resist material.

In one embodiment which may be combined with one or more of the before-addressed method embodiments, said main portion and said surrounding portion form a unitary part.

In one embodiment which may be combined with one or more of the before-addressed method embodiments, step a) comprises the step of
a1) manufacturing said optical structure using replication, in particular using embossing.

In one embodiment which may be combined with one or more of the before-addressed method embodiments, step a) comprises the step of
a2) providing a first wafer comprising a multitude of said first substrates.

Considering step b1), usually the whole first wafer (more precisely one side thereof) is spray-coated and/or spin-coated. Considering step b2), usually substantially the first whole wafer (more precisely one side thereof) is coated.

The method for manufacturing an opto-electronic module comprises the steps of
A) providing a first wafer comprising a multitude of optical structures, each of said optical structures comprising a main portion and a surrounding portion at least partially surrounding said main portion;
B) applying a non-transparent material at least onto each of said surrounding portions.

In one embodiment of that method, said non-transparent material is present at least on said surrounding portions in the finished opto-electronic module. It may be present also on a portion of the respective main portions. And it may be contiguous for all (or for at least two) of the optical structures of the opto-electronic module.

In one embodiment which may be combined with the before-addressed embodiment, said first wafer comprises a first side on which said multitude of surrounding portions is present, wherein step B) comprises the step of
B3) applying said non-transparent material onto said first side substantially in full, in particular using at spin coating or spray coating.

In one embodiment which may be combined with one or more of the before-addressed embodiments of that method, the method comprises subsequently to step B3) the step of
U) structuring the non-transparent material applied in step B3), in particular photostructuring the non-transparent material applied in step B3), more particularly using UV radiation in said photostructuring.

In one embodiment which may be combined with one or more of the before-addressed embodiments of that method, the method comprises the steps of
D) providing a second wafer comprising a multitude of active or passive optical components;
E) providing a spacer wafer comprising a multitude of openings;
F) forming a wafer stack, in particular by fixing said first wafer to said second wafer via said spacer wafer.

In one embodiment referring to the last-addressed embodiment, step F) comprises the step of
F1) applying a bonding material between said spacer wafer and said first wafer and between said spacer wafer and said second wafer.

In particular, step F) may comprise the step of

F2) hardening said bonding material using radiation, in particular UV radiation.

Hardening can also be accomplished by heating. Said bonding material can be, e.g., a glue, e.g., an epoxy resin.

Note, however, that the spacer wafer might be integrated in said first or in said second wafer, in which case in step F1), bonding material would be applied between that specific wafer (at that side where it forms the spacer wafer) and the respective other wafer.

In one embodiment referring to one or both of the two last-addressed embodiments, said wafer stack comprises a multitude of opto-electronic modules, each of said opto-electronic modules comprising a plurality of said active or passive optical components;
a plurality of said optical structures;
exactly one of said multitude of openings.

Therein, usually, one of said multitude of opto-electronic modules is the opto-electronic module to be manufactured using the method.

In one embodiment referring to the last-addressed embodiment, each of said opto-electronic modules comprises a material portion of said spacer wafer delimiting the opening comprised in the respective opto-electronic module.

In one embodiment referring to the last-addressed embodiment, said spacer wafer is not in contact with said first wafer and/or with said second wafer anywhere within said opening, in particular wherein no material portion of said spacer wafer is located with said opening.

In one embodiment referring to one or more of the three the last-addressed embodiments, the method comprises the step of G) separating said wafer stack into said multitude of opto-electronic modules.

This can be accomplished using dicing techniques, e.g., sawing, laser cutting and others.

The use is a use of resist material for reducing stray light in an optical sensor. The resist or—more generally—the before-mentioned non-transparent material may be, e.g., black, or white, ore differently colored.

In particular, it can be a use of resist material for reducing stray light in an optical sensor comprising an optical device according to the invention.

More specifically, said optical sensor is at least one of
a multi-channel camera or a module therefor;
a multi-aperture camera or a module therefor;
a computational camera or a module therefor;
an array camera or a module therefor;
a plenoptic camera or a module therefor;
a photo camera or a module therefor;
a video camera or a module therefor.

Partially redundant to the above description of the invention, it is to be noted that:

The invention also comprises optical devices with features of corresponding methods according to the invention, and, vice versa, also methods with features of corresponding optical devices according to the invention. Therein, the advantages of the optical devices basically correspond to the advantages of corresponding methods, and, vice versa, the advantages of the methods basically correspond to the advantages of corresponding optical devices.

The invention also comprises optical devices with features of corresponding opto-electronic modules according to the invention, and, vice versa, also opto-electronic modules with features of corresponding optical devices according to the invention. Therein, the advantages of the optical devices basically correspond to the advantages of corresponding opto-electronic modules, and, vice versa, the advantages of the opto-electronic modules basically correspond to the advantages of corresponding optical devices.

The invention also comprises opto-electronic modules with features of corresponding methods according to the invention, and, vice versa, also methods with features of corresponding opto-electronic modules according to the invention. Therein, the advantages of the opto-electronic modules basically correspond to the advantages of corresponding methods, and, vice versa, the advantages of the methods basically correspond to the advantages of corresponding opto-electronic modules.

And the invention also comprises wafers and wafer stacks, respectively, with features of corresponding optical devices and/or opto-electronic modules and/or methods; and vice versa also optical devices and/or opto-electronic modules and/or methods with features of corresponding wafers and wafer stacks, respectively. Therein, the respective advantages are basically corresponding.

Further embodiments and advantages emerge from the dependent claims and the figures.

BRIEF DESCRIPTION OF THE DRAWINGS

Below, the invention is described in more detail by means of examples and the included drawings. The figures show schematically.

The described embodiments are meant as examples and shall not confine the invention.

DETAILED DESCRIPTION OF THE INVENTION

Figure 1:
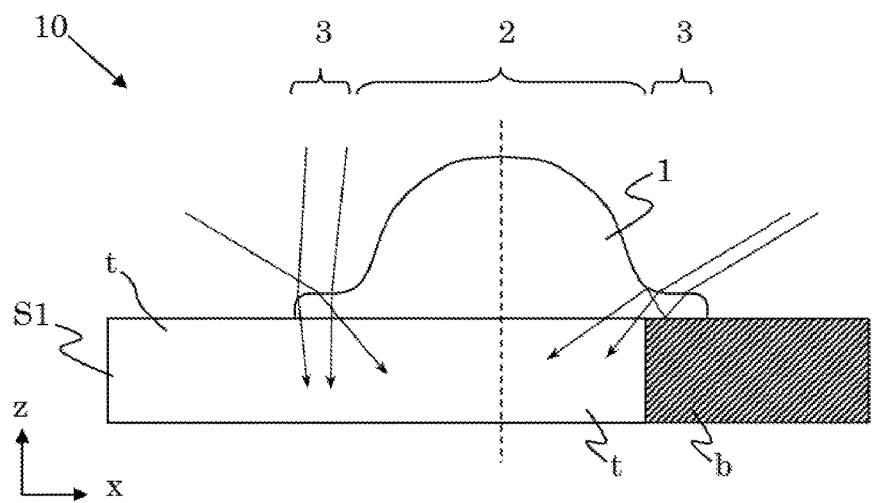
FIG. 1 an illustration of a cross-section through an optical device.

FIG. 1 is a schematic illustration of a cross-section through an optical device 10. Throughout the Figures, the z axis designates a vertical direction, and the x and y axes designate lateral directions, cf. also the definitions further above. Optical device 10 comprises a substrate S1 and an optical structure 1 comprising a main portion 2 surrounded by a surrounding portion 3, main portion 2 forming a passive optical component such as a lens or lens element as illustrated in FIG. 1. The presence of surrounding portion 3 can be due to the way of manufacturing optical structure 1, e.g., when a replication process such as an embossing process is used for manufacturing optical structure 1.

In the left portion of FIG. 1, it is assumed and illustrated that substrate S1 is transparent, i.e. it basically consists of a transparent portion t. As is illustrated by the thin arrows in the left portion of FIG. 1, light impinging on surrounding portion 3 can traverse optical structure 1 and substrate S1. Usually this is undesirable, and the light having passed substrate S1 will usually be considered stray light.

In the right portion of FIG. 1, it is assumed and illustrated that substrate S1 is partially transparent (having a transparent portion t) and partially non transparent (blocking portion b). This can in fact block some of the light impinging on surrounding portion 3 from passing substrate S1, but as illustrated by the thin arrows in the right portion of FIG. 1, some undesired light might still pass substrate S1.

Figure 2:
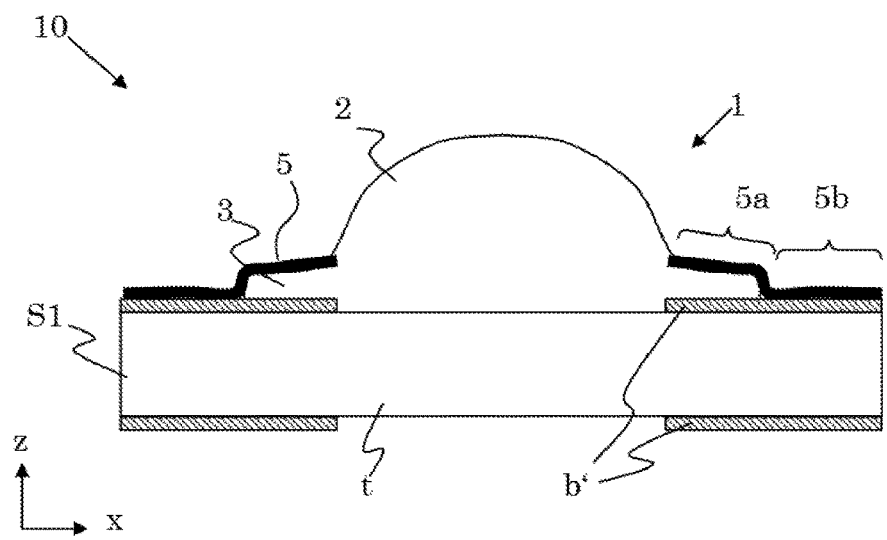
FIG. 2 an illustration of a cross-section through an optical device.

Having recognized that this can be detrimental to the optical quality of the optical device, the inventors found a solution which is illustrated in FIG. 2 solving that problem.

FIG. 2 is a schematic illustration of a cross-section through an optical device 10 comprising non-transparent material 5 on the surrounding portion 3. There is not only non-transparent material 5 on surrounding portion 3, referenced 5a, but also non-transparent material 5 on the surface of substrate S1, referenced 5b, where the surface of substrate S1 is not occupied by optical structure 1. Providing this can be particularly useful if substrate S1 is fully transparent, like, e.g., in the left portion of FIG. 1, but may under various conditions also be valuable if substrate S1 is partially non transparent, e.g., like in the case of a non-transparent substrate coating such as a blocking layer b' illustrated in FIG. 2. Such circumstances can be, e.g., that blocking layer b' is partially reflective (although this usually is undesired) and wherein optical device 10 is a portion of an opto-electronic module. This will become clearer when discussing opto-electronic modules farther below.

Figure 3:
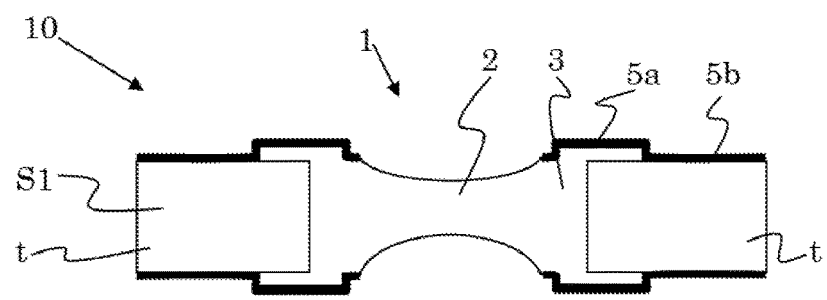
FIG. 3 an illustration of a cross-section through an optical device.

FIG. 3 is a schematic illustration of a cross-section through another optical device 10 comprising non-transparent material 5 on the surrounding portion 3. The effect of providing non-transparent material 5b is evident, considering that substrate S1 is substantially transparent. In contrast to optical devices of FIGS. 1 and 2, in FIG. 3 the optical structure 1 is sitting (at least) partially in an opening of substrate S1 and not in full on substrate S1. Nevertheless, the improvements in optical quality achievable by non-transparent material 5 (which forms a film or a layer at least on surrounding portion 3) are the same as mentioned above in conjunction with FIG. 2.

Non-transparent material 5 can be, e.g., a (non transparent) resist material, such as a structurable polymer material. This can simplify the application of non-transparent material 5. The non-transparent material 5 may have virtually any color. It can in particular be black, but may also be white. But it might also be green or blue or of another color.

Figure 4:
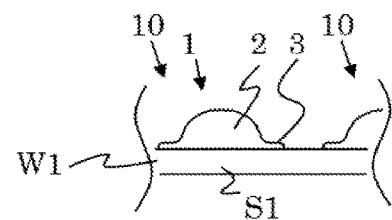
FIG. 4 an illustration of a cross-section through a detail of a wafer comprising optical devices, for illustrating the application of a resist.
Figure 5:
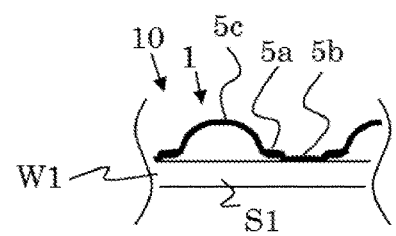
FIG. 5 an illustration of a cross-section through a detail of a wafer comprising optical devices, for illustrating the application of a resist.
Figure 6:
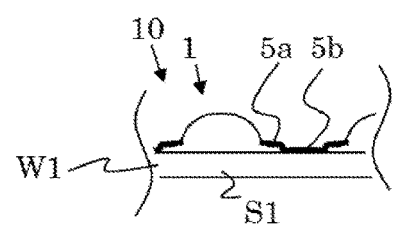
FIG. 6 an illustration of a cross-section through a detail of a wafer comprising optical devices, for illustrating the application of a resist.

FIGS. 4 to 6 are schematic illustrations of a cross-section through a detail of a wafer W1 comprising optical devices 10, for illustrating the application of a resist material.

FIG. 4 illustrates the optical device before application of the material 5. Wafer W1 comprises a multitude of optical devices 10 and thus a multitude of optical structures 1.

FIG. 5 illustrates what wafer W1 looks like after it has been fully covered (usually on one side only) with material 5. Material 5 can be applied, e.g., using spin coating or spray coating. Non-transparent material 5 (resist material) not only covers, as desired, surrounding portion 3 (cf. reference 5a) and those portions of substrate S1 and the wafer W1, respectively, which are not occupied by optical structure 1 (cf. reference 5b), but also main portion 2 (cf. reference 5c), i.e. in the case illustrated in FIG. 4, the lens is covered which, however, should be free from non-transparent material in order to be useful. Thus, the accomplished layer of non-transparent (resist) material should be structured, so as to free main portion 2 from non-transparent material. But it may also be acceptable or even desirable to have some of the non-transparent material 5 present on main portion 2 (cf., e.g., FIG. 11 described further below).

A suitable non-transparent resist material for forming layers if non-transparent material 5 can be, e.g., SKS-A070A and SKS-A070B available from Fujifilm (http://www.fujifilm-ffem.com/products/photoresist.aspx).

FIG. 6 illustrates what wafer W1 looks like after suitably structuring material 5. (Resist) material 5 is removed from main portion 2. This can be accomplished using, e.g., standard lithographic processes such as photostructuring. The (resist) material 5 is, e.g., exposed to light in a suitable manner and then etched or exposed to a solvent for removing material 5 from main portion 2 while letting material 5 remain in place at desired places (cf. references 5a, 5b).

It has to be noted that when material 5 is a resist material, this resist material is not used in the standard way of using resist material. The latter would mean that the resist material would rather be used in order to enable a (structured) application of some other material, but, more importantly, that the resist material would be removed again, usually soon, but at least before finishing the optical device. In the present patent application, however, it is proposed to let the resist material remain in the optical device, i.e. the resist material is comprised in the optical device and therein provides a useful function (blocking undesired light propagation).

Figure 7:
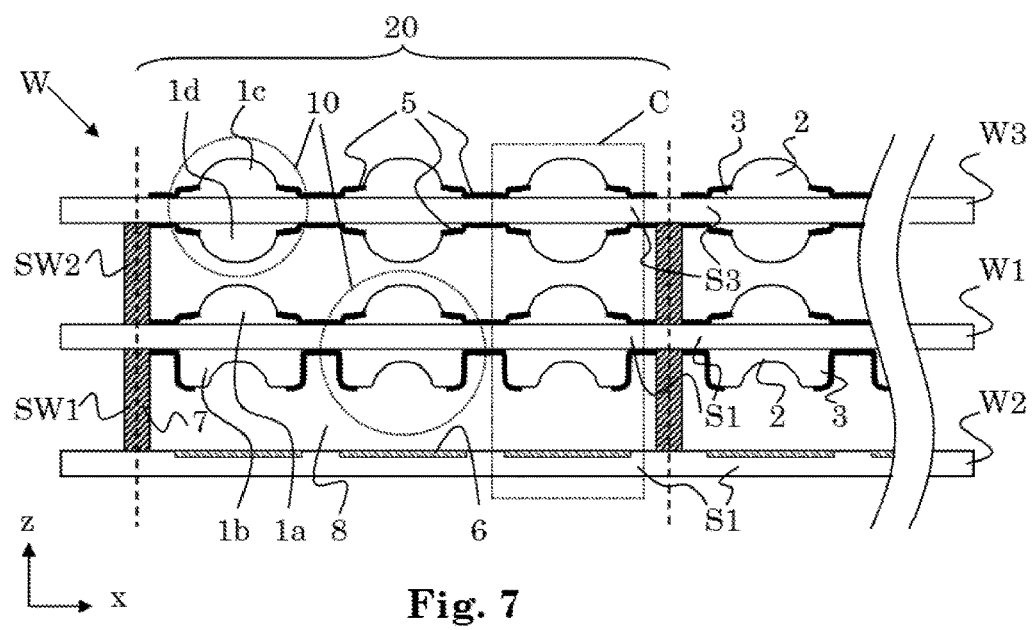
FIG. 7 an illustration of a cross-section through a detail of a wafer stack for the manufacture of multi-channel opto-electronic modules.

FIG. 7 is a schematic illustration of a cross-section through a detail of a wafer stack W for the manufacture of multi-channel opto-electronic modules 20. Wafer stack W comprises five wafers: Wafers W1, W2 and W3 and spacer wafers SW1 and SW2.

Wafer W1 comprises a multitude of optical devices 10, each comprising an optical structure 1a and an optical structure 1b, both on opposing sides of wafer W1. It would also be possible to provide optical structures on one side only, e.g., only optical structures 1a or only optical structures 1b. Wafer W1 also forms a multitude of transparent substrates S1 on which the optical structures 1a and 1b are sitting.

Wafer W3 (which is an optional wafer) comprises a multitude of optical devices 10, each comprising an optical structure 1c and an optical structure 1d, both on opposite sides of wafer W3. It would also be possible to provide optical structures on one side only, i.e. only optical structures 1c or only optical structures 1d. Wafer W3 also forms a multitude of transparent substrates S3 on which the optical structures 1c and 1d are sitting.

Within each opto-electronic module 20, non-transparent material 5 is applied to the surrounding portions 2 and to the substrate surface exposed between any two of the optical structures, whereas the main portions 2 are free from the non-transparent material. Depending on the specific application of the module 20, it is also possible to partially of fully omit the application of non-transparent material to one or both sides of the respective wafer.

Of course, the shapes and types of the optical structures may vary with respect to what is illustrated in the Figures, e.g., refractive and diffractive lenses, concave ones and convex ones and any other passive optical component or combination of passive optical components can be implemented.

Wafer W2 comprises a multitude of active optical components 6 such as image sensors each provided in or on one of a multitude of substrate S2. Active and passive optical components vertically arranged after each other form an optical channel C. In the cross-sectional view of FIG. 7, in one module 20, there are three channels C present. Depending on the specific application, each channel within an opto-electronic module 20 is (at least nominally) different from the other channels of the respective opto-electronic module 20, or it can be provided that two or more, in particular all of the channels are (at least nominally) different from each other. Typically, each channel allows to catch one sub-image, and from the plurality of sub-images, a final image can be obtained, usually by means of processing, e.g., image processing using one or more suitable algorithms.

The spacer wafers SW1, SW2 are arranged (sandwiched) between other wafers so as to provide a well-defined distance between these. In addition, spacer wafers may be non-transparent in order to inhibit or at least reduce an undesired entry of light from the outside of an opto-electronic module 20 into the opto-electronic module 20. But any one of spacer wafers SW1 and SW2 can also be fully or partially transparent.

Note, however, that in a slightly modified version of the embodiment of FIG. 7, spacer wafer SW1 would be comprised in wafer W2 or rather in wafer W1, and/or spacer wafer SW2 would be comprised in wafer W1 or in wafer W3. E.g., a precursor wafer for a combined wafer W1 (with spacer wafers SW1 and SW2 integrated) could be manufactured, e.g., using replication such as injection molding or embossing, and on that precursor wafer, optical structures 1a and 1b would be produced.

One opto-electronic module 20 covers laterally an area defined by an opening 8 in a spacer wafer plus the area of a spacer member 7 provided by the spacer wafer, wherein spacer member 7 usually delimits opening 8.

One possibility for reducing cross-talk between different channels C of a module 20, would be, e.g., to provide spacer members 7 (in particular non-transparent ones) not only between neighboring opto-electronic modules 20 comprised in wafer stack W, but also between neighboring channels C in each opto-electronic module 20. This, however may constitute a limitation for the minimum distance between neighboring optical structures and thus a limitation for the minimum distance between neighboring optical channels C, which finally constitutes a limitation for minimum achievable (lateral) extension of each opto-electronic module 20.

The other possibility, however, is the before-addressed provision of non-transparent material 5, in particular when applied in the described way. And this way of reducing stray light and/or cross-talk will usually not constitute a limitation for the minimum distance between neighboring optical structures, thus making particularly small opto-electronic modules 20 possible (at least as far as their lateral extension is concerned).

Substrates S1 and S3 may (independently from each other) be either (substantially) fully transparent (as illustrated in FIG. 7), or partially transparent, e.g., comprising transparent portions t and blocking portions b like illustrated in the right-hand portion of FIG. 1, or transparent with one or more blocking layers 8' thereon, e.g., like illustrated in FIG. 2. Separation of the wafer stack W into opto-electronic modules 20 can take place along the dashed lines in FIG. 7.

Figure 8:
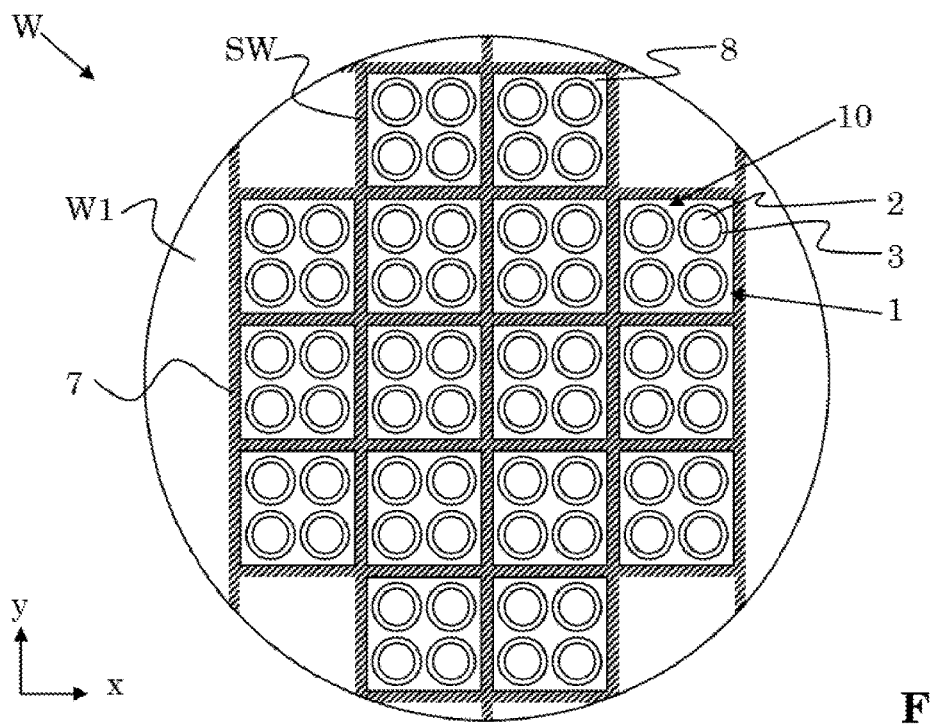
FIG. 8 an illustration of a view onto a wafer stack for the manufacture of multi-channel opto-electronic modules, comprising a wafer of optical devices and a spacer wafer, with no resist applied.

FIG. 8 is a schematic illustration of a view onto a wafer stack W for the manufacture of multi-channel opto-electronic modules, comprising a wafer W1 of optical devices 10 and a spacer wafer SW, with no non-transparent material applied. Each opto-electronic module which can be manufactured making use of this wafer stack W would comprise four channels, arranged in a 2×2 array. Wafer W1 can, e.g., be transparent, comprising a multitude of optical structures 1. Spacer wafer SW laterally delimits the manufacturable opto-electronic modules.

Figure 9:
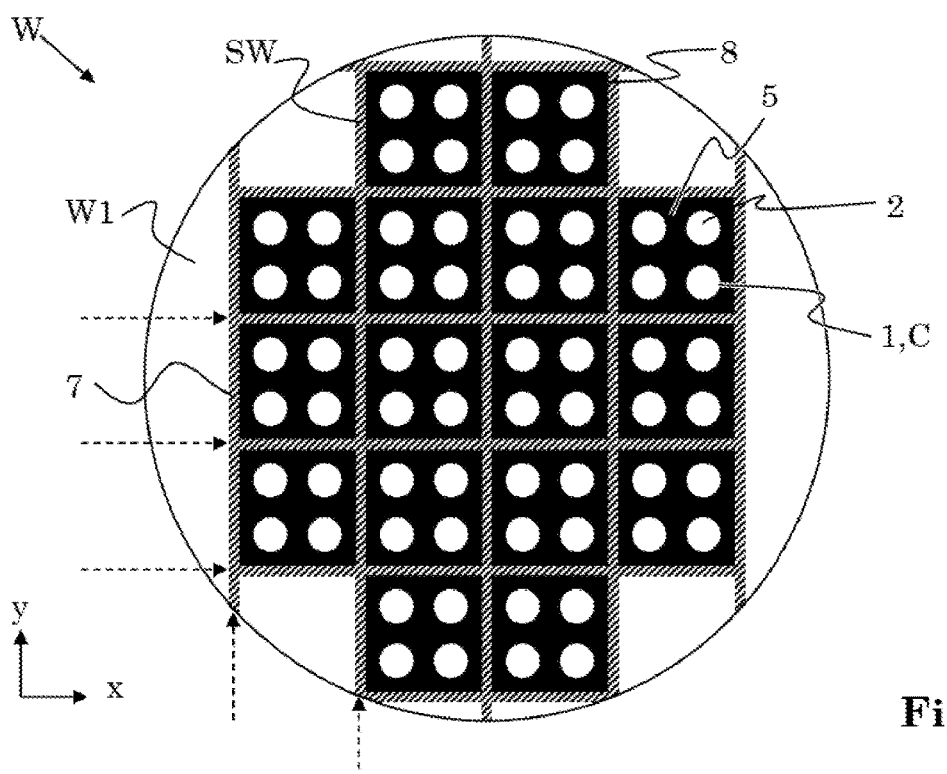
FIG. 9 an illustration of a view onto the wafer stack of FIG. 8, with resist applied and structured.

FIG. 9 is a schematic illustration of a view onto the wafer stack W of FIG. 8, with non-transparent material 5 applied and structured. Usually, the application of material 5 will take place when no further wafer is attached to the wafer to be coated, at least not attached to that side of the wafer which shall be coated.

Like in the case of the embodiment of FIG. 7, material 5 such as a non-transparent polymer-based resist can be applied substantially all over one side of the wafer (in FIG. 8: wafer W1) and then be structured in a generally known way, e.g., using photostructuring. Therein, at least the main portions 2 of the optical structures 10 are freed from material 5. In addition, as illustrated in FIGS. 7 and 9, also those surface portions can be freed from material 5 at which a spacer wafer (in FIG. 9: spacer wafer SW; in FIG. 7: spacer wafer SW1 and/or SW2) will be in contact with the coated wafer. This creates well-defined conditions with respect to the finally achieved distance between wafers (thickness uncertainties of material 5 do then not contribute to that distance) and enables a simpler material management since less materials contribute to the bonding between wafers. But it would generally also be possible to let the material 5 remain there, and remove material 5 only in the areas taken by the main portions 2.

From wafer W1 of FIGS. 8 and 9, optical devices can be manufactured. Together with spacer wafer SW and at least one additional wafer, other optical devices or opto-electronic modules could be manufactured; in the latter case, one additional wafer would comprise active optical components, e.g., like wafer W2 of FIG. 7.

For forming a wafer stack, a bonding material such as a glue, e.g., UV-curable or thermally curable glue, e.g., an epoxy, can be applied. For example, all wafers contributing to a wafer stack (and finally to an optical device or opto-electronic module to be manufactured) can be stacked upon each other in the desired way with a suitable bonding material therebetween, and then, in a single curing or hardening step, the wafer stack can be formed. It is also possible to apply two or more subsequent bonding steps, each time adding one or more additional wafers until all wafers are comprised in the stack.

When the wafer stack is complete and finished, it can be separated into a multitude of opto-electronic modules. Known separating (dicing) techniques can be used, e.g., laser cutting, sawing. In FIG. 9, some of the lines where separation will take place are indicated by dashed arrows.

Figure 10:
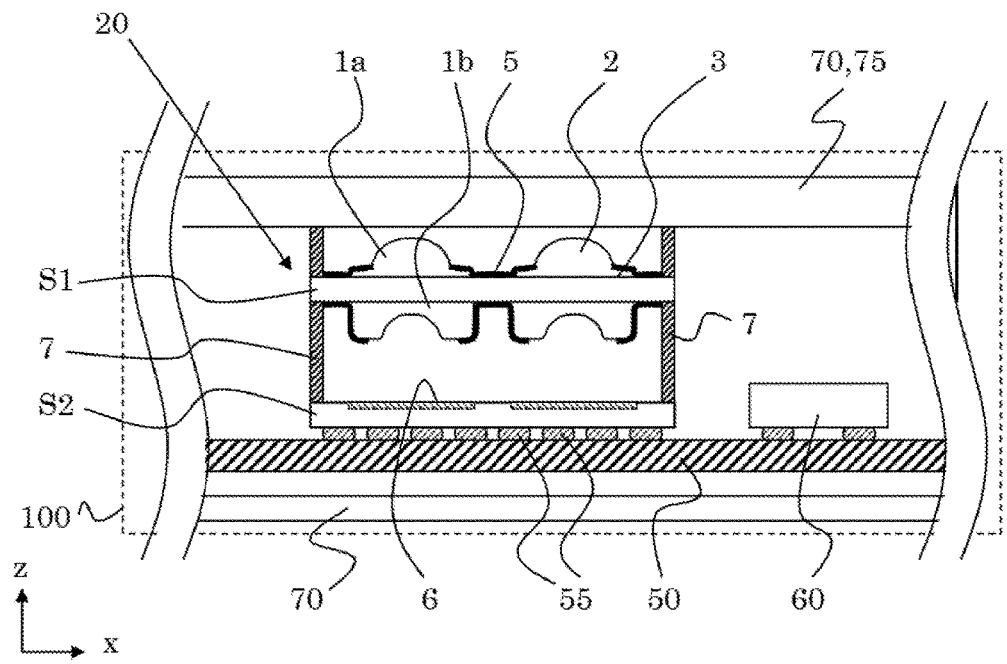
FIG. 10 an illustration of a cross-section through a detail of an electronic device comprising a multi-channel opto-electronic module.

FIG. 10 is a schematical illustration of a cross-section through a detail of an electronic device 100 comprising a multi-channel opto-electronic module 20. The electronic device 100 comprises a housing 70 comprising a cover glass 75 to which opto-electronic module 20 can be attached and a printed circuit board 50 comprising further electronic components such as electronic component 60. Opto-electronic module 20 is operationally connected to printed circuit board 50, e.g., via solder balls 55 as illustrated in FIG. 10. Spacer members 7 and substrate S2 form a housing of opto-electronic module 20, at least on five sides of opto-electronic module 20. In the cross-sectional view of FIG. 10, in one module 20, there are two channels C present. Electronic device 100 can be, e.g., computational camera, an array camera, a multi-aperture camera, a plenoptic camera, wherein in these cases, the active optical components 6 would typically be multi-pixel image sensors such as CMOS-based image chips, e.g., like used in today's digital photo cameras. Each channel of opto-electronic module 20 may allow to catch one sub-image, and from the plurality of sub-images caught by opto-electronic module 20, a final image can be obtained, usually by means of processing, e.g., image processing using one or more suitable algorithms. A final image may be obtainable within electronic device 100, e.g., making use of electronic component 60, and/or a final image can be obtained in an external device into which data descriptive of said sub-images have been loaded, e.g., a computer with a suitable software.

Electronic device 100 could also be something else, e.g., a multi-channel optical sensor in which active optical components 6 could be photo diodes.

Also, an opto-electronic module 20 (of FIG. 7 or of FIG. 10) alone can already be considered to embody an electronic device such as a camera or optical sensor.

Figure 11:
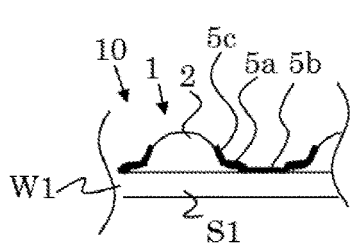
FIG. 11 an illustration of a cross-section through a detail of a wafer comprising optical devices, for illustrating the application of a resist such that a portion of a main portion of an optical structure is covered.

FIG. 11 is an illustration of a cross-section through a detail of a wafer W1 comprising optical devices 10, for illustrating the application of a resist such that a portion of the main portions 2 of the optical structures 1 is covered. It can be valuable to cover a portion, typically an outer portion, of the main portion 2 of the optical structure 1 with non-transparent material 5c, e.g., for producing the functionality of an aperture, or for even more strongly inhibiting propagation of stray light, or for improving imaging properties (by not using portions of the main portion 2 for imaging which are or are likely to be shaped less precisely than desirable or than other (typically inner) portions of the main portion 2. Optical devices 10 as illustrated in FIG. 11 may be obtained like the ones of FIG. 6 (cf. above; FIGS. 4, 5), but not fully removing non-transparent material from main portion 2, but letting remain portions thereof, cf. reference 5c in FIG. 11.

Figure 12:
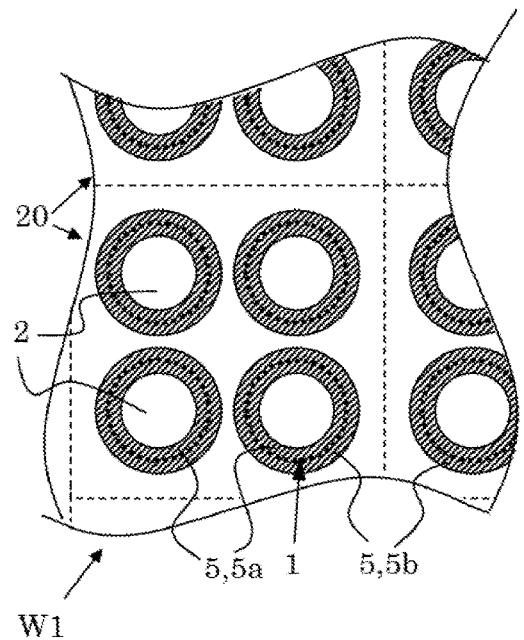
FIG. 12 an illustration of a view onto a detail of a wafer, with resist applied and structured.

FIG. 12 is an illustration of a view onto a detail of a wafer W1, with resist applied and structured. Four-channel optical modules, e.g., four-channel opto-electronic modules can be obtained using such a wafer W1 (cf. the dashed straight lines), e.g., for a computational camera. Whereas in the embodiment illustrated in FIG. 9, the resist applied to (neighboring) optical structures 1 of each optical module 20 is contiguous, this is not the case in the embodiment of FIG. 12. In FIG. 12, the applied non-transparent material 5 is separate for each optical structure 1.

Figure 13:
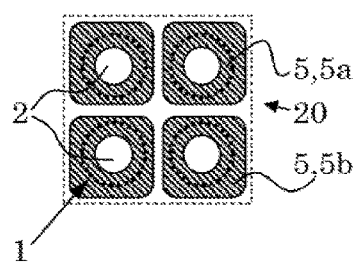
FIG. 13 an illustration of a view onto an optical module, with resist applied and structured.

FIG. 13 is an illustration of a view onto an optical module 20, with resist 5 applied and structured. This is merely to illustrate another (lateral) shape described by non-transparent material 5. In this case, for each optical structure 1, a rectangular shape (optionally, as illustrated, with rounded corners) is chosen, whereas in FIG. 12, circular shapes are illustrated. Also other shapes are possible. And, as illustrated, a center of gravity of the applied non-transparent material (more particularly, of the shape it describes laterally) does not necessarily have to coincide with a center of gravity of the respective optical structure 1 or main portion 2 (again, more particularly, of the shape it describes laterally).

The manufacturing methods illustrated in the present patent application are well suitable to be carried out on wafer scale which is highly efficient and can allow high-quality high-throughput mass production.

Thus, the present disclosure describes, among other things, an optical device comprising a first substrate comprising at least one optical structure comprising a main portion; and a surrounding portion at least partially surrounding the main portion; wherein the device further comprised non-transparent material applied onto the surrounding portion. Some implementations include one or more of the following features:

- The main portion forms a passive optical component, in particular a lens or a lens element, more particularly a refractive lens or lens element.
- The main portion and the surrounding portion form a unitary part.
- The device comprises further non-transparent material applied onto a surface portion of the first substrate adjacent to the surrounding portion.
- The device comprises a layer of the non-transparent material, the layer substantially coating the surrounding portion.
- The layer substantially coating, in addition, a surface portion of the first substrate adjacent to the surrounding portion.
- The non-transparent material is a resist material, in particular a polymer-based resist material.
- The non-transparent material is photostructurable.

In another aspect, the disclosure describes an opto-electronic module comprising a plurality of the optical devices comprised in the first substrate. Some implementations include one or more of the following features:

- The module comprises a plurality of active optical components, in particular wherein the active optical components are light detectors.
- The module comprises a second substrate comprising the plurality of active optical components.
- The module comprises a spacer member arranged between the first substrate and the second substrate, for establishing a well-defined distance between the first substrate and the second substrate.
- The spacer member is not in contact with the first substrate in any area of the first substrate between any two of the plurality of optical structures.
- The spacer member is not in contact with the second substrate in any area of the second substrate between any two of the plurality of active optical components.
- The spacer member forms an opening, and the spacer comprises at least one wall member at least partially surrounding the opening, in particular wherein the at least one wall member forms a portion of a housing of the module.
- In the opening, no material portion of the spacer member is located.
- The first and second substrates are generally planar describing parallel planes, and wherein, in a projection into any one of these parallel planes, each of the plurality of optical structures and each of the plurality of active optical components lie within the spacer member.

In the projection into any of these parallel planes, no portion of the spacer member is located between any two of the plurality of optical structures or between any two of the plurality of active optical components.

Each of the active optical components is a multi-pixel light detector.

The plurality of optical structures are N≥2 optical structures, and the plurality of active optical components are N≥2 active optical components, each of the N active optical components being assigned to and aligned with respect to one of the N optical structures.

The module is a multi-channel optical sensor.

The module is a multi-channel camera or a module for a multi-channel camera or a multi-aperture camera or a module for a multi-aperture camera.

In a further aspect, the disclosure describes an opto-electronic module comprising at least one device as set forth above. Some implementations include one or more of the following features:

The module comprises at least one active optical component arranged in a distance to the main portion, in particular wherein the at least one active optical component is a light detector for detecting light having passed the main portion.

The module comprises a second substrate comprising the at least one active optical component.

The module comprises a spacer member arranged between the first substrate and the second substrate, for establishing a well-defined distance between the first substrate and the second substrate.

The module is an optical sensor, in particular a camera or a module for a camera.

In another aspect, the disclosure describes a wafer stack comprising a first wafer comprising a multitude of optical devices as set forth above and a second wafer and a spacer wafer arranged between the first and the second wafer. Some implementations include one or more of the following features:

The second wafer comprises a multitude of active or passive optical components.

The spacer wafer forms a multitude of openings laterally delimited by material portions of the spacer wafer, wherein the wafer stack comprises a multitude of laterally defined portions, each of the portions of the wafer stack comprising exactly one of the multitude of openings; a plurality of the active or passive optical components; and a plurality of the optical devices.

Each of the laterally defined portions of the wafer stack comprises no material portion of the spacer wafer in contact with the first wafer within the opening.

Each of the laterally defined portions of the wafer stack comprises no material portion of the spacer wafer in contact with the second wafer within the opening.

Each of the laterally defined portions of the wafer stack comprises no material portion of the spacer wafer within the opening.

Each of the laterally defined portions of the wafer stack, for at least one side of the first wafer, substantially the whole surface of the side of the first wafer which is not occupied by the main portions of the respective optical structures is covered with the non-transparent material.

The second wafer comprises a multitude of optical devices as set forth above.

The second wafer comprises a multitude of light detectors, in particular a multitude of multi-pixel light detectors.

Each of the laterally defined portions of the first wafer forms an opto-electronic module.

Each of the laterally defined portions of the first wafer comprises a material portion of the spacer wafer delimiting the respective opening.

In a further aspect describes a wafer stack comprising a multitude of opto-electronic modules as set forth above or a multitude of opto-electronic modules as set forth above.

In another aspect, a wafer comprises a multitude of optical devices as set forth above.

The disclosure also describes a method for manufacturing an optical device comprising:

a) providing a first substrate comprising at least one optical structure comprising a main portion and a surrounding portion at least partially surrounding said main portion; and b) applying a non-transparent material at least onto said surrounding portion.

Some implementations include one or more of the following features:

The non-transparent material is present on at least the surrounding portion in the finished optical device, in particular when the optical device is packaged.

b) comprises b1) applying the non-transparent material by at least one of spray coating and spin coating.

The first substrate comprises a first side on which the surrounding portion is present, wherein b) comprises b2) applying said non-transparent material to the first side substantially in full.

The method comprises u) structuring the non-transparent material applied in b1) and/or b2), in particular using photostructuring.

a) comprises a1) manufacturing said optical structure using replication, in particular using embossing.

a) comprises a2) providing a first wafer comprising a multitude of the first substrates.

In accordance with another aspect, the disclosure describes a method for manufacturing an opto-electronic module comprising:

A) providing a first wafer comprising a multitude of optical structures, each of said optical structures comprising a main portion and a surrounding portion at least partially surrounding said main portion;

B) applying a non-transparent material at least onto each of said surrounding portions.

Some implementations include one or more of the following features:

The non-transparent material is present at least on the surrounding portions in the finished opto-electronic module.

The first wafer comprises a first side on which the multitude of surrounding portions is present, wherein B) comprises B3) applying the non-transparent material onto the first side substantially in full, in particular using at spin coating or spray coating.

Subsequent to B3), performing U) structuring the non-transparent material applied in B3), in particular photostructuring the non-transparent material applied in B3), more particularly using UV radiation in the photostructuring.

The method comprises:

D) providing a second wafer comprising a multitude of active or passive optical components;

E) providing a spacer wafer comprising a multitude of openings; and

F) forming a wafer stack by fixing said first wafer to said second wafer via said spacer wafer.

The method comprises:

F1) applying a bonding material between the spacer wafer and the first wafer and between the spacer wafer and the second wafer; and in particular, F2) hardening the bonding material using radiation, in particular UV radiation.

The wafer stack comprises a multitude of opto-electronic modules, each of the opto-electronic modules comprising a plurality of the active or passive optical components; a plurality of the optical structures; and exactly one of the multitude of openings.

Each of the opto-electronic modules comprises a material portion of the spacer wafer delimiting the opening comprised in the respective opto-electronic module.

The spacer wafer is not in contact with the first wafer and/or with the second wafer anywhere within the opening, in particular wherein no material portion of the spacer wafer is located with the opening.

The method comprises G) separating said wafer stack into said multitude of opto-electronic modules.

In another aspect, the disclosure describes an electronic device comprising at least one optical device as set forth above and/or at least one opto-electronic module as set forth above, in particular wherein the electronic device is at least one of:

a communication device, more particularly a handheld communication device;

a photographic device, more particularly a photo camera or a video camera;

a music playing device, more particularly a handheld music playing device;

a computing device, more particularly a mobile computing device, e.g., a tablet computer or a laptop computer;

an optical sensor, in particular a multichannel optical sensing apparatus.

Some implementations include one or more of the following features:

Use of resist material for reducing stray light in an optical sensor, in particular wherein the optical sensor comprises an optical device as set forth above.

The invention claimed is:

1. A wafer comprising a multitude of optical devices, each of the optical devices comprising a first substrate comprising at least one optical structure comprising a main portion; and a surrounding portion at least partially laterally surrounding the main portion;

each main portion and the respective surrounding portion forming a unitary part, wherein each of the optical devices further comprises non-transparent material applied onto the respective surrounding portion, wherein the non-transparent material applied to the surrounding portion of a first one of the optical structures is non-contiguous with the non-transparent material applied to the surrounding portion of a second one of the optical structures, and wherein the first and second opticals structures are arranged laterally side-by-side.

2. The wafer according to claim 1, wherein for each of the optical devices, the respective main portion forms a passive optical component.

3. The wafer according to claim 1, wherein each of the optical devices comprises further non-transparent material applied onto a surface portion of the respective first substrate adjacent to the respective surrounding portion, the further non-transparent material being continuous with the non-transparent material applied to the respective surrounding portion.

4. The wafer according to claim 1, wherein the non-transparent material is a resist material.

5. The wafer according to claim 1, wherein the non-transparent material is photostructurable.

6. The wafer according to claim 1, wherein the non-transparent material applied to the surrounding portion of a any one of the optical structures is non-contiguous with the non-transparent material applied to the surrounding portion of any other one of the optical structures.

7. The wafer according to claim 1, wherein for each of the optical devices, the respective at least one optical structure is sitting on the first substrate or is located fully or in part in the first substrate.

8. An opto-electronic module comprising a plurality of optical devices and comprising a first substrate, wherein each of the optical devices comprises a portion of the first substrate comprising at least one optical structure comprising a main portion; and a surrounding portion at least partially laterally surrounding said main portion;

each main portion and the respective surrounding portion forming a unitary part, wherein each of the optical devices further comprises non-transparent material applied onto the respective surrounding portion, wherein the non-transparent material applied to the surrounding portion of a first one of the optical structures is non-contiguous with the non-transparent material applied to the surrounding portion of a second one of the optical structures, and wherein the first and second opticals structures are arranged laterally side-by-side.

9. The opto-electronic module according to claim 8, comprising a plurality of active optical components and a second substrate comprising the plurality of active optical components.

10. The opto-electronic module according to claim 9, comprising a spacer member arranged between the first substrate and the second substrate, for establishing a well-defined distance between the first substrate and the second substrate.

11. The opto-electronic module according to claim 9, wherein the plurality of optical structures are N≥2 optical structures, and the plurality of active optical components are N≥2 active optical components, each of the N active optical components being assigned to and aligned with respect to one of the N optical structures, N being an integer.

12. The opto-electronic module according to claim 8, wherein the opto-electronic module is a multi-channel optical sensor.

13. A wafer stack comprising a first wafer comprising a multitude of optical devices, wherein each of the optical devices comprises a first substrate comprised in the first wafer and comprises at least one optical structure comprising a main portion; and a surrounding portion at least partially laterally surrounding the main portion;

each main portion and the respective surrounding portion forming a unitary part, wherein each of the optical devices further comprises non-transparent material applied onto the respective surrounding portion, wherein the non-transparent material applied to the surrounding portion of a first one of the optical structures is non-contiguous with the non-transparent material applied to the surrounding portion of a second one of the optical structures, and wherein the first and second opticals structures are arranged laterally side-by-side.

14. The wafer stack according to claim 13, wherein for each of the optical structures, the non-transparent material applied to the surrounding portion of the respective optical structure is non-contiguous with the non-transparent material applied to the surrounding portion of another one of the optical structures.

15. The wafer stack according to claim 13, further comprising
   a second wafer; and
   a spacer wafer arranged between the first and the second wafer.

16. The wafer stack according to claim 15, wherein the second wafer comprises a multitude of active or passive optical components.

* * * * *